United States Patent
Lee (10) Patent No.: US 11,915,944 B2
(45) Date of Patent: Feb. 27, 2024

(54) SUBSTRATE PROCESSING APPARATUS AND SUBSTRATE PROCESSING METHOD

(71) Applicant: Tokyo Electron Limited, Tokyo (JP)

(72) Inventor: Suguen Lee, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 419 days.

(21) Appl. No.: 17/104,103

(22) Filed: Nov. 25, 2020

(65) Prior Publication Data

US 2021/0166957 A1  Jun. 3, 2021

(30) Foreign Application Priority Data

Nov. 29, 2019 (JP) ................ 2019-217116

(51) Int. Cl.
*H01L 21/67* (2006.01)
*H01L 21/68* (2006.01)
*H01L 21/687* (2006.01)

(52) U.S. Cl.
CPC .... *H01L 21/67051* (2013.01); *H01L 21/6708* (2013.01); *H01L 21/67253* (2013.01); *H01L 21/68* (2013.01); *H01L 21/68764* (2013.01); *H01L 21/67028* (2013.01)

(58) Field of Classification Search
CPC ............... H01L 21/68; H01L 21/67051; H01L 21/67253; H01L 21/6708; H01L 21/67028; H01L 21/68764
See application file for complete search history.

(56) References Cited

U.S. PATENT DOCUMENTS 10,730,059 B2 * 8/2020 Kobayashi ........ H01L 21/67028
2020/0234998 A1 * 7/2020 Kosugi ............. H01L 21/67051

FOREIGN PATENT DOCUMENTS

| EP | 618611 B1 * | 6/1998 | ............... B08B 3/08 |
| JP | 2003-273070 A | 9/2003 | |
| JP | 2011054819 A * | 3/2011 | ....... H01L 21/02057 |
| JP | 2012-204720 A | 10/2012 | |

(Continued)

OTHER PUBLICATIONS

Machine Translation of JP 5813551-B2 to Kikuchi, 2015. (Year: 2015).*

(Continued)

*Primary Examiner* — Benjamin L Osterhout
(74) *Attorney, Agent, or Firm* — Pearne & Gordon LLP (57) ABSTRACT

A substrate processing apparatus includes a holder configured to hold a substrate horizontally; a substrate rotating unit configured to rotate the holder; a nozzle configured to supply a fluid onto a top surface of the substrate; a supply unit configured to supply the fluid to the nozzle; and a moving unit configured to move the nozzle in a diametrical direction of the substrate. The nozzle includes a first nozzle member configured to discharge the fluid and a second nozzle member configured to discharge the fluid in a direction different from a direction in which the first nozzle member discharges the fluid. Discharge lines of the first and the second nozzle members intersect with each other at an intersection point. The supply unit includes a first and a second flow rate controllers configured to respectively control discharge amounts of the first and the second nozzle members independently.

18 Claims, 9 Drawing Sheets

(56) References Cited

FOREIGN PATENT DOCUMENTS

| | | | |
|---|---|---|---|
| JP | 5813551 | B2 * | 11/2015 |
| JP | 2018-533465 | A | 11/2018 |
| JP | 2019-016654 | A | 1/2019 |
| WO | 2017/059405 | A1 | 4/2017 |

OTHER PUBLICATIONS

Machine Translation of JP 2011054819-A to Kikuchi, 2011. (Year: 2011).*

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-217116 filed on Nov. 29, 2019, the entire disclosure of which is incorporated herein by reference.

TECHNICAL FIELD

The various aspects and embodiments described herein pertain generally to a substrate processing apparatus and a substrate processing method.

BACKGROUND

A substrate processing apparatus described in Patent Document 1 forms a liquid film of IPA (IsoPropyl Alcohol) on a top surface of a substrate being rotated and then moves a supply position of the IPA from a center of the substrate toward a periphery thereof. As a result, an opening is formed at a center of the liquid film, and an edge of the opening is then expanded from the center of the substrate W toward the periphery thereof, so that the substrate W is dried. Further, the substrate processing apparatus jets a $N_2$ gas to the opening of the liquid film of the IPA, thus allowing the edge of the opening to be pressed by the $N_2$ gas. As the edge of the opening is expanded from the center of the substrate toward the periphery thereof, a supply position of the $N_2$ gas is moved from the center of the substrate toward the periphery thereof.

A substrate processing apparatus disclosed in Patent Document 2 is equipped with a nozzle configured to discharge a processing liquid toward a top surface of a substrate; a nozzle moving mechanism configured to move the nozzle along the top surface of the substrate; and a discharge angle varying mechanism configured to vary a discharge angle of the nozzle. The discharge angle varying mechanism varies the discharge angle of the nozzle by changing a joint angle of a multi-joint arm which supports the nozzle.

Patent Document 1: Japanese Patent Laid-open Publication No. 2019-016654

Patent Document 2: Japanese Patent Laid-open Publication No. 2012-204720

SUMMARY

In one exemplary embodiment, a substrate processing apparatus includes a holder configured to hold a substrate horizontally; a substrate rotating unit configured to rotate the holder and the substrate thereon around a vertical rotation axis; a nozzle configured to supply a fluid onto a top surface of the substrate held by the holder; a supply unit configured to supply the fluid to the nozzle; and a moving unit configured to move the nozzle in a diametrical direction of the substrate. The nozzle includes a first nozzle member configured to discharge the fluid and a second nozzle member configured to discharge the fluid in a direction different from a direction in which the first nozzle member discharges the fluid. A discharge line of the first nozzle member and a discharge line of the second nozzle member intersect with each other at an intersection point. The supply unit includes a first flow rate controller configured to control a discharge amount of the first nozzle member and a second flow rate controller configured to control a discharge amount of the second nozzle member independently from the discharge amount of the first nozzle member.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. Further, in the various drawings, same or corresponding parts will be assigned same reference numerals, and redundant description may be omitted. In the present specification, the X-axis direction, the Y-axis direction, and the Z-axis direction are orthogonal to each other. The X-axis and Y-axis directions are horizontal directions, and the Z-axis direction is a vertical direction.

Figure 1:
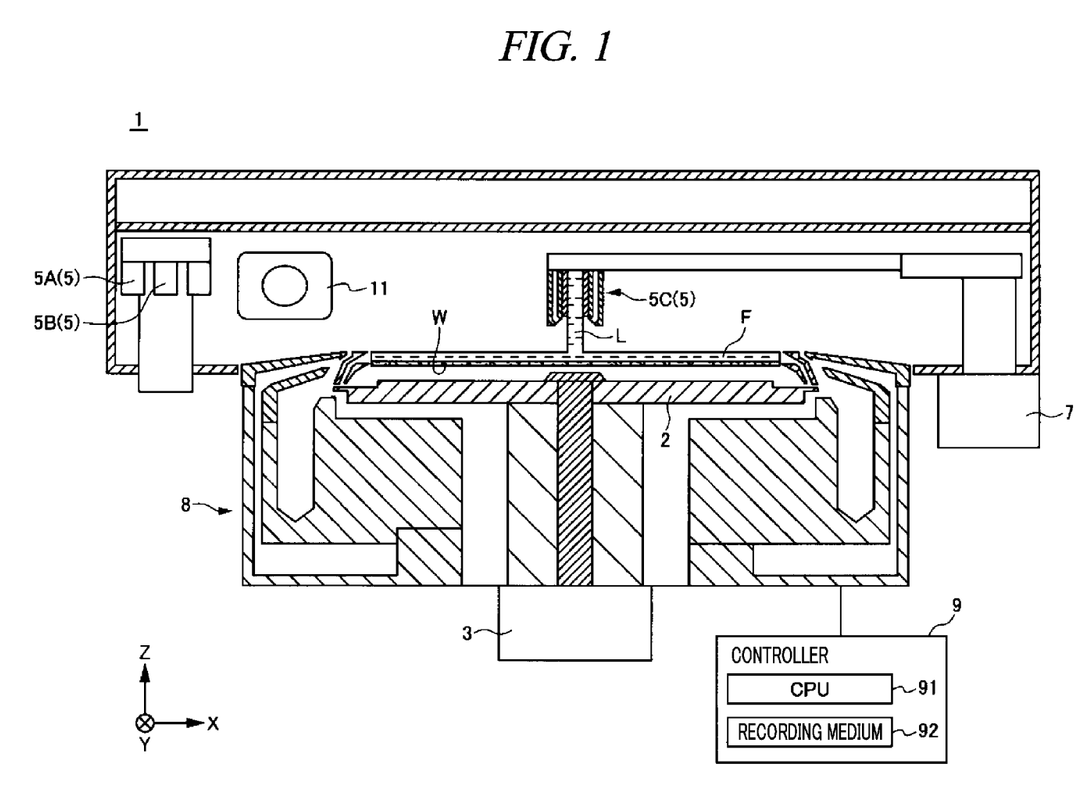
FIG. 1 is a cross sectional view of a substrate processing apparatus according to an exemplary embodiment, showing a state of a process S4 in FIG. 4.
Figure 2:
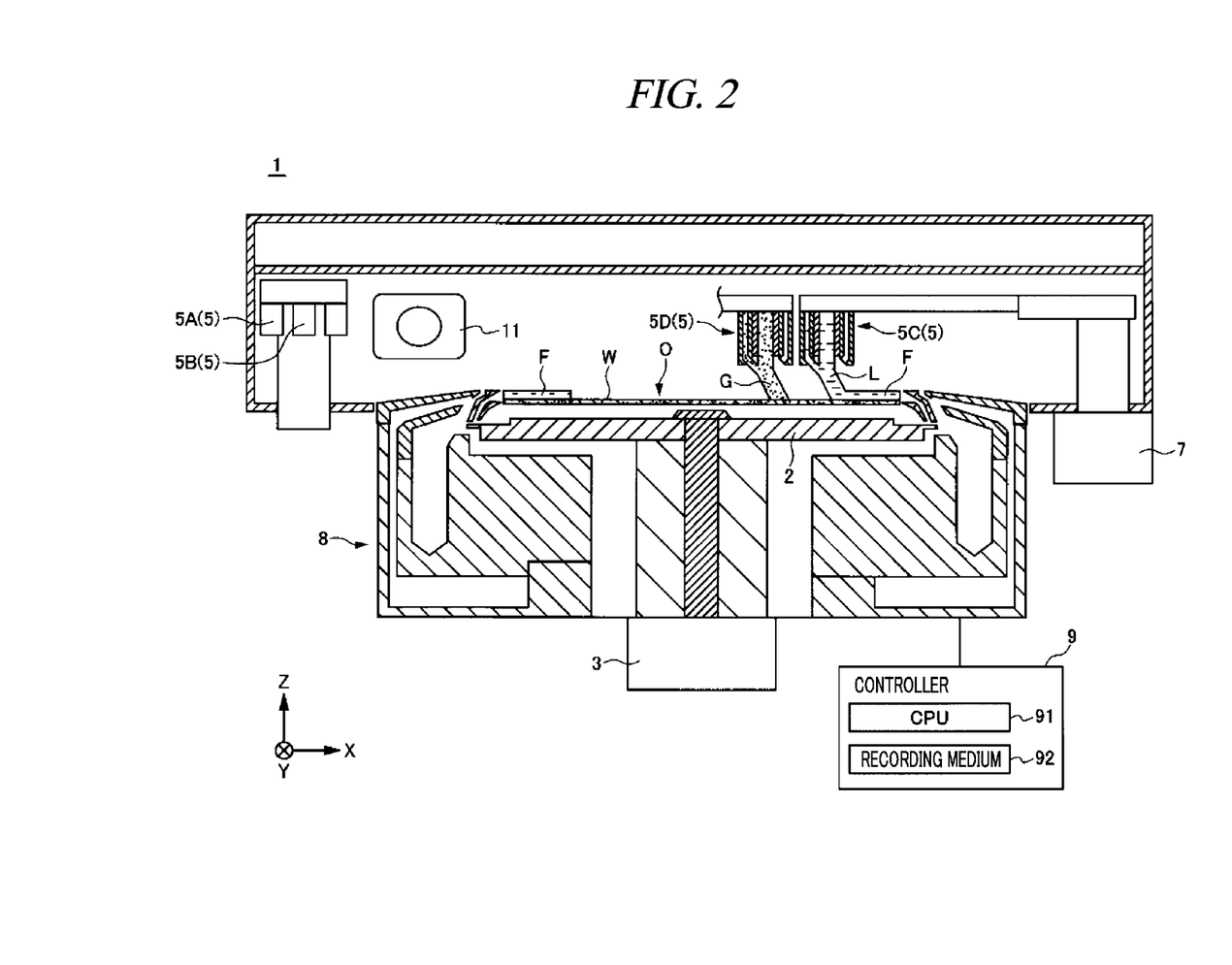
FIG. 2 is a cross sectional view of the substrate processing apparatus according to the exemplary embodiment, showing a state of a process S5 in FIG. 4.

As shown in FIG. 1 and FIG. 2, a substrate processing apparatus 1 includes a holder 2, a substrate rotating unit 3, a nozzle 5, a supply unit 6 (see FIG. 5), a moving unit 7, a cup 8, and a controller 9. The holder 2 holds a substrate W horizontally. The holder 2 may be, by way of example, a mechanical chuck, a vacuum attraction chuck, an electrostatic chuck, or the like. The substrate rotating unit 3 is configured to rotate the holder 2 and the substrate W thereon around a vertical rotation axis. The nozzle 5 supplies a fluid onto a top surface of the substrate W held by the holder 2. The fluid may be either a liquid or a gas, or may be a mixture of the liquid and the gas. The supply unit 6 supplies the fluid to the nozzle 5. The moving unit 7 moves the nozzle 5 in a diametrical direction of the substrate W to allow the nozzle 5 to be moved above the substrate W held by the holder 2. The cup 8 accommodates therein the holder 2 and collects the fluid supplied onto the substrate W.

The nozzle 5 supplies the fluid onto the top surface of the substrate W held by the holder 2. The number of the nozzle 5 may be one or more. By way of example, multiple nozzles 5 including a chemical liquid nozzle 5A, a rinse liquid nozzle 5B, a drying liquid nozzle 5C and a drying gas nozzle 5D may be used.

The chemical liquid nozzle 5A supplies a chemical liquid onto the top surface of the substrate W. The chemical liquid is supplied onto a center of the substrate W being rotated, for example, and is diffused from the center of the substrate W toward a periphery thereof by a centrifugal force, forming a liquid film. Though the chemical liquid is not particularly limited, DHF (Dilute HydroFluoric acid) may be used, for example.

Any of various kinds of general chemical liquids for use in cleaning of a semiconductor substrate may be utilized, and the chemical liquid is not limited to the aforementioned DHF. By way of example, the chemical liquid may be SC-1 (an aqueous solution including ammonium hydroxide and hydrogen peroxide) or SC-2 (an aqueous solution including hydrogen chloride and hydrogen peroxide). Further, multiple kinds of chemical liquids may be used together.

The rinse liquid nozzle 5B supplies a rinse liquid onto the top surface of the substrate W. The rinse liquid is supplied onto the center of the substrate W being rotated, for example, and is diffused from the center of the substrate W toward the periphery thereof by the centrifugal force. Accordingly, the chemical liquid included in the liquid film is replaced by the rinse liquid. As a result, a liquid film of the rinse liquid is formed. Though not particularly limited, pure water such as, but not limited to, DIW (DeIonized Water) or the like may be used as the rinse liquid.

The drying liquid nozzle 5C supplies a drying liquid L onto the top surface of the substrate W. The drying liquid L is supplied onto the center of the substrate W being rotated, for example, and is diffused from the center of the substrate W toward the periphery thereof by the centrifugal force. Accordingly, the rinse liquid included in the liquid film is replaced by the drying liquid. As a result, a liquid film F of the drying liquid L is formed. Though not particularly limited, an organic solvent such as, but not limited to, IPA (IsoPropyl Alcohol) may be used as the drying liquid L.

The drying liquid L covers the entire top surface of the substrate W, and, then, exposes the substrate W gradually from the center toward the periphery thereof. To elaborate, after the liquid film F of the drying liquid L is formed, a collision point of the drying liquid L is moved from the center of the substrate W toward the periphery thereof. As a result, an opening O is formed at a center of the liquid film F, and an edge of the opening O is then expanded from the center of the substrate W toward the periphery thereof, so that the substrate W is dried.

Further, the drying liquid L is not limited to the IPA as long as it has a surface tension lower than that of the rinse liquid to suppress a collapse of a non-illustrated irregularity pattern formed on the top surface of the substrate W. The drying liquid L may be, by way of non-limiting example, HFE (Hydrofluoroether), methanol, ethanol, acetone, or trans-1,2-dichloroethylene. If, however, the replacement from the rinse liquid into the drying liquid is not required, the rinse liquid is used as the drying liquid.

The drying gas nozzle 5D supplies a drying gas G onto the top surface of the substrate W. The drying gas G is supplied into, for example, the opening O of the liquid film F and presses the edge of the opening O from the inside. A collision point of the drying gas G is moved from the center of the substrate W toward the periphery thereof as the edge of the opening O is expanded. An inert gas such as a $N_2$ gas may be used as the drying gas G.

The moving unit 7 moves the nozzle 5 in the diametrical direction of the substrate W to allow the nozzle 5 to be moved above the substrate W held by the holder 2. The collision point of the fluid on the top surface of the substrate W can be moved in the diametrical direction of the substrate W. The moving unit 7 may also be configured to move the nozzle 5 in a vertical direction. Further, a height of the nozzle 5 from the substrate W may be adjustable. The moving unit 7 may move the multiple nozzles 5 at the same time or move them independently.

Figure 3:
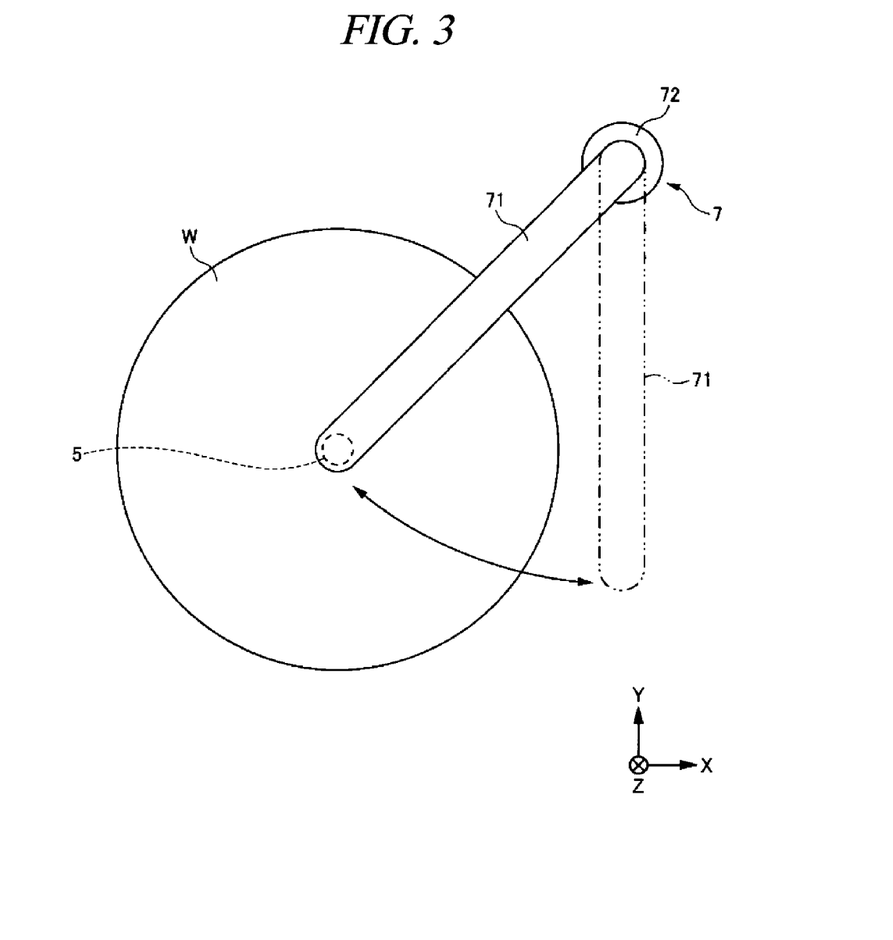
FIG. 3 is a plan view illustrating an example of a moving unit configured to move a nozzle.

As depicted in FIG. 3, the moving unit 7 is equipped with a rotary arm 71 configured to hold the nozzle 5; and a rotating mechanism 72 configured to rotate the rotary arm 71. The rotating mechanism 72 may also be configured to move the rotary arm 71 up and down. The rotary arm 71 is placed horizontally, and holds the nozzle 5 with a leading end thereof. The rotating mechanism 72 rotates the rotary arm 71 around a rotation axis which is extended downwards from a base end of the rotary arm 71. The rotary arm 71 is rotated between a position indicated by a solid line in FIG. 3 and a position indicated by a dashed double-dotted line in FIG. 3.

Further, the moving unit 7 may be equipped with, instead of the rotary arm 71 and the rotating mechanism 72, a guide rail and a linearly moving mechanism. The guide rail is placed horizontally, and the linearly moving mechanism moves the nozzle 5 along the guide rail.

The controller 9 may be, by way of example, a computer, and includes a CPU (Central Processing Unit) 91 and a recording medium 92 such as a memory, as depicted in FIG. 1. The recording medium 92 stores a program for controlling various processings performed in the substrate processing apparatus 1. The controller 9 controls an operation of the substrate processing apparatus 1 by allowing the CPU 91 to execute the program stored in the recording medium 92.

Now, a substrate processing method will be described with reference to FIG. 4. The substrate processing method includes processes S1 to S6 of FIG. 4. The processes S1 to S6 of FIG. 4 are performed under the control of the controller 9.

Figure 4:
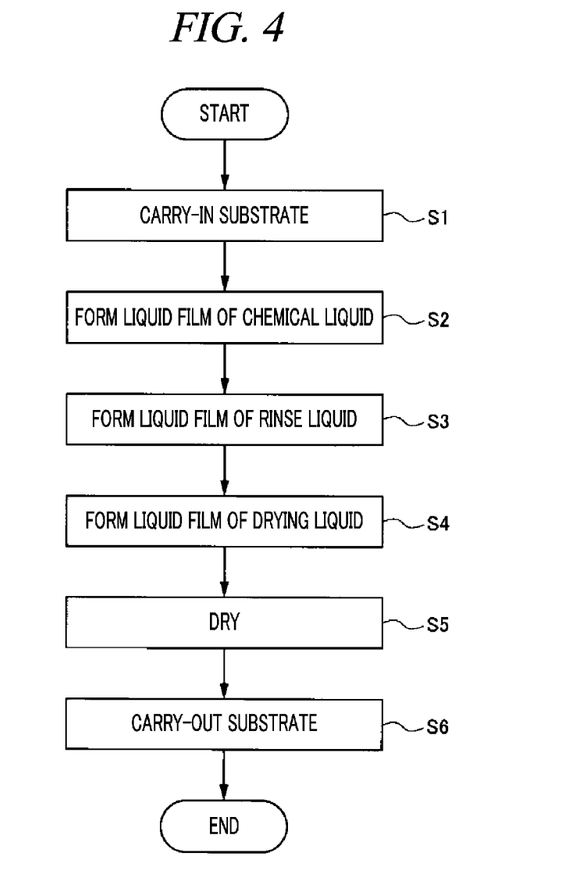
FIG. 4 is a flowchart illustrating a substrate processing method according to the exemplary embodiment.

First, in the process S1 of FIG. 4, a non-illustrated transfer device carries the substrate W into the substrate processing apparatus 1. The transfer device delivers the substrate W onto the holder 2, and is then retreated from the substrate processing apparatus 1. The holder 2 holds the substrate W horizontally. The substrate W includes a semiconductor substrate such as a silicon wafer and a film formed on the semiconductor substrate. The film may have an irregularity pattern. The holder 2 holds the substrate W horizontally while allowing the irregularity pattern to face upwards. Further, a glass substrate may be used instead of the semiconductor substrate.

Then, in the process S2 of FIG. 4, the chemical liquid nozzle 5A supplies the chemical liquid onto the top surface of the substrate W, thus forming a liquid film of the chemical liquid thereon. The chemical liquid is supplied onto the center of the substrate W being rotated, for example, and is diffused from the center of the substrate W toward the periphery thereof by a centrifugal force. A rotation number of the substrate W and a supply flow rate of the chemical liquid are set to allow the entire irregularity pattern of the substrate W to be covered with the liquid film.

Thereafter, in the process S3 of FIG. 4, the rinse liquid nozzle 5B supplies the rinse liquid onto the top surface of the substrate W, thus forming a liquid film of the rinse liquid. The rinse liquid is supplied onto the center of the substrate W being rotated, for example, and is diffused from the center of the substrate W toward the periphery thereof by the centrifugal force. Accordingly, the chemical liquid included in the liquid film is replaced by the rinse liquid. A rotation number of the substrate W and a supply flow rate of the rinse liquid are set to allow the entire irregularity pattern of the substrate W to be still covered with the liquid film.

Subsequently, in the process S4 of FIG. 4, the drying liquid nozzle 5C supplies the drying liquid L onto the top surface of the substrate W, as illustrated in FIG. 1, thus forming the liquid film F of the drying liquid L. The drying liquid L is supplied onto the center of the substrate W being rotated, for example, and is diffused from the center of the substrate W toward the periphery thereof by the centrifugal force. Accordingly, the rinse liquid included in the liquid film F is replaced by the drying liquid. A rotation number of the substrate W and a supply flow rate of the drying liquid L are set to allow the entire irregularity pattern of the substrate W to be still covered with the liquid film F.

Afterwards, in the process S5 of FIG. 4, as illustrated in FIG. 2, the moving unit 7 moves the drying liquid nozzle 5C from an inner side toward an outer side of the substrate W in the diametrical direction thereof. Accordingly, the opening O is formed at the center of the liquid film F, and the opening edge is then expanded from the center of the substrate W toward the periphery thereof, so that the substrate W is dried. Further, with the expansion of the opening edge of the liquid film F, the moving unit 7 moves the collision point of the drying gas G from the center of the substrate W toward the periphery thereof. The collision point of the drying gas G is set to be located in the opening O of the liquid film F and made to follow the opening edge to press the opening edge from the inside thereof.

Finally, in the process S6 of FIG. 4, the holder 2 releases the holding of the substrate W, and the non-illustrated transfer device receives the substrate W from the holder 2 and takes out the received substrate W from the substrate processing apparatus 1.

Now, referring to FIG. 5 and FIG. 6, the drying liquid nozzle 5C will be explained. Further, the drying gas nozzle 5D may have the same configuration as the drying liquid nozzle 5C. Furthermore, the chemical liquid nozzle 5A and the rinse liquid nozzle 5B may have the same configuration as the drying liquid nozzle 5C. Below, the configuration of the drying liquid nozzle 5C will be described representatively.

Figure 6:
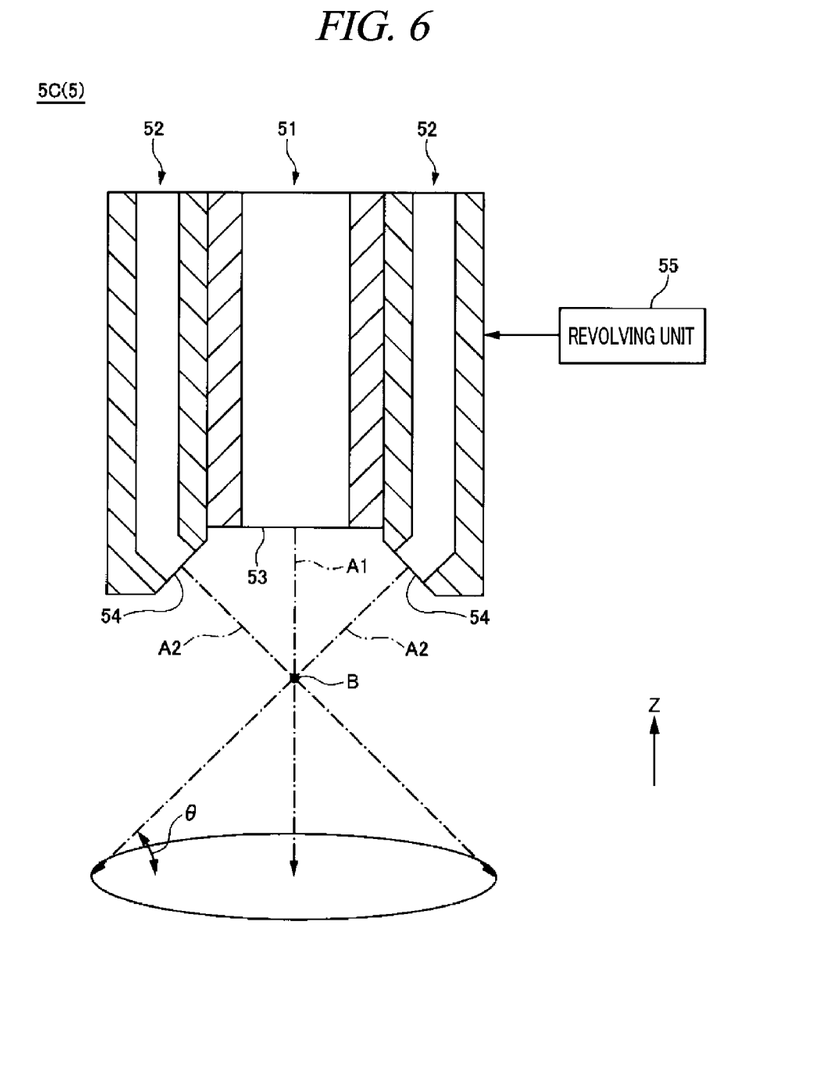
FIG. 6 is a vertical cross sectional view of the drying liquid nozzle taken along a line VI-VI of FIG. 5.

As shown in FIG. 6, the drying liquid nozzle 5C has a first nozzle member 51 for discharging the drying liquid L and second nozzle members 52 for discharging the drying liquid L in directions different from a direction in which the first nozzle member 51 discharges the drying liquid. A discharge line A1 of the first nozzle member 51 and discharge lines A2 of the second nozzle members 52 intersect with each other at an intersection point B. Here, the discharge lines A1 and A2 are extension lines of flow paths of the drying liquid L. A liquid flow of the drying liquid L discharged from the first nozzle member 51 and a liquid flow of the drying liquid L discharged from the second nozzle members 52 meet at the intersection point B, forming a new single liquid flow.

Figure 5:
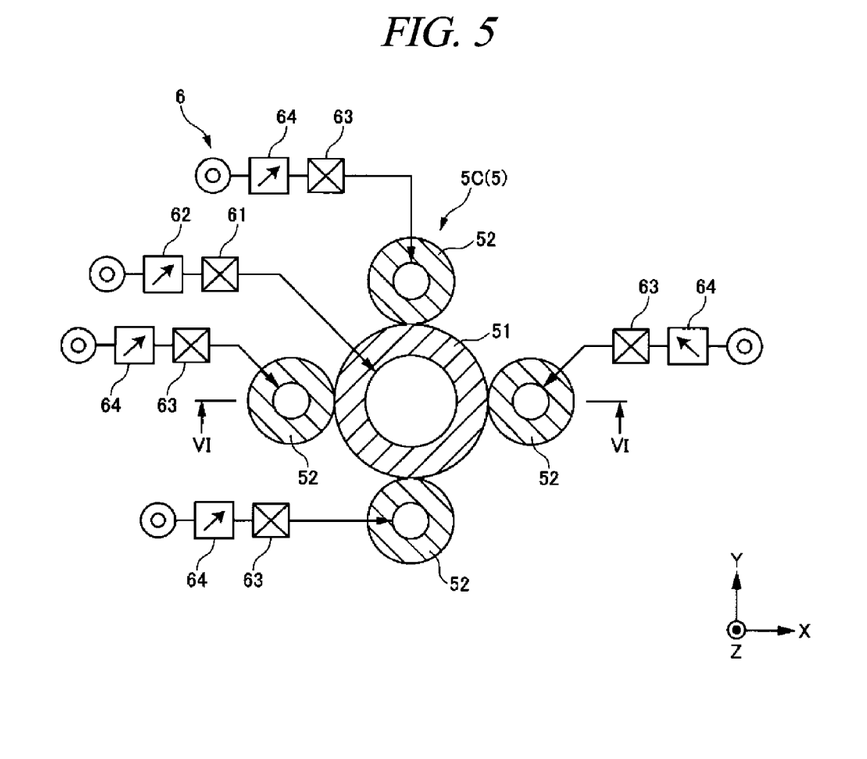
FIG. 5 is a horizontal cross sectional view illustrating an example of a drying liquid nozzle of FIG. 1.

As illustrated in FIG. 5, the supply unit 6 is equipped with a first opening/closing valve 61 and a first flow rate controller 62 at a part of a first supply line through which the drying liquid L is supplied to the first nozzle member 51. If the first opening/closing valve 61 opens a flow path for the drying liquid L, the first nozzle member 51 discharges the drying liquid L. A discharge amount is controlled by the first flow rate controller 62. Meanwhile, if the first opening/closing valve 61 closes the flow path for the drying liquid L, the first nozzle member 51 stops the discharge of the drying liquid L. Further, the first flow rate controller 62 itself may have a function of the first opening/closing valve 61.

Further, the supply unit 6 is equipped with a second opening/closing valve 63 and a second flow rate controller 64 at a part of a second supply line through which the drying liquid L is supplied to the second nozzle member 52. If the second opening/closing valve 63 opens a flow path for the drying liquid L, the second nozzle member 52 discharges the drying liquid L. A discharge amount is controlled by the second flow rate controller 64. Meanwhile, if the second opening/closing valve 63 closes the flow path for the drying liquid L, the second nozzle member 52 stops the discharge of the drying liquid L. Further, the second flow rate controller 64 itself may have a function of the second opening/closing valve 63.

The second flow rate controller 64 controls the discharge amount of the second nozzle member 52 independently from the discharge amount of the first nozzle member 51. Since the discharge amount of the first nozzle member 51 and the discharge amount of the second nozzle member 52 can be controlled independently, a collision angle θ of the drying liquid L on the top surface of the substrate W as shown in FIG. 6 can be appropriately varied. The collision angle θ is set to suppress the drying liquid L from being spattered. Thus, particle generation due to the spattering of the liquid can be suppressed.

According to the present exemplary embodiment, the discharge amount of the first nozzle member 51 and the discharge amount of the second nozzle member 52 are controlled independently, and the collision angle θ of the drying liquid L on the top surface of the substrate W is controlled. Thus, as compared to the case where the joint angle of the multi-joint arm is changed as in Patent Document 2, particle generation by friction can be suppressed.

Though the multiple second nozzle members 52 are provided in the present exemplary embodiment, only one second nozzle member 52 may be provided. If the multiple second nozzle members 52 are provided, multiple second supply lines are provided, and the second flow rate controller 64 is provided at a part of each of the multiple second supply lines. With this configuration, discharge amounts of the multiple second nozzle members 52 can be controlled independently.

As depicted in FIG. 6, the discharge lines A2 of the multiple second nozzle members 52 intersect with the discharge line A1 of the first nozzle member 51 at the one and the same intersection point B. Unlike from a case where different intersection points B exist for the individual second nozzle members 52, liquid flows of the second nozzle members 52 can be allowed to join the liquid flow of the first nozzle member 51 regardless of the discharge amounts of the second nozzle members 52.

Four or more (four in FIG. 5) second nozzle members 52 are equi-spaced around the discharge line A1 of the first nozzle member 51. The four second nozzle members 52 are arranged at an angular interval of 90°. If the number of the second nozzle members 52 is four or more, the collision point of the drying liquid L can be moved in all directions orthogonal to the discharge line A1 of the first nozzle member 51. Further, the number of the second nozzle members 52 is not limited to four. For example, eight second nozzle members 52 may be provided.

The drying liquid nozzle 5C may further include a revolving unit 55 configured to revolve the second nozzle members 52 around the discharge line A1 of the first nozzle member 51. Since a horizontal component of the discharge line A2 of each second nozzle member 52 can be revolved around the intersection point B, a direction of this horizontal component can be adjusted.

The revolving unit 55 revolves the multiple second nozzle members 52 in the same direction at the same speed. Thus, the multiple second nozzle members 52 can be maintained at the regular interval therebetween. Further, the revolving unit 55 may revolve the multiple second nozzle members 52 individually.

The revolution of the second nozzle member 52 by the revolving unit 55 may be performed when the drying liquid nozzle 5C is rotated with the rotary arm 71 shown in FIG. 3, for example. If a turning radius of the drying liquid nozzle 5C is small, the drying liquid nozzle 5C draws a circular arc-shaped trajectory. Thus, the revolving unit 55 revolves the second nozzle member 52 so that the horizontal component of the discharge line A2 is maintained in the diametrical direction or circumferential direction of the substrate W.

Further, if the turning radius of the drying liquid nozzle 5C is large and the trajectory of the drying liquid nozzle 5C can be regarded as being a straight line, the revolving unit 55 may not revolve the second nozzle member 52. It is because the horizontal component of the discharge line A2 can be maintained in the diametrical direction or circumferential direction of the substrate W even if the revolving unit 55 does not revolve the second nozzle member 52.

As illustrated in FIG. 5, the first nozzle member 51 is of a cylindrical shape, and the four second nozzle members 52 are arranged at the regular interval in a circumferential direction of the first nozzle member 51. Each of the four second nozzle members 52 is of a cylindrical shape. If both the first nozzle member 51 and the second nozzle members 52 have the cylindrical shape, it is easy to revolve the second nozzle members 52 around the discharge line A1 of the first nozzle member 51.

Further, the shapes of the first nozzle member 51 and the second nozzle members 52 may not be limited to the cylindrical shape. By way of example, the first nozzle member 51 may have a rectangular barrel shape, and the four second nozzle members 52 may be respectively fixed to four sides of the first nozzle member 51. Each of the four second nozzle members 52 may have a rectangular barrel shape as well.

Furthermore, though the first nozzle member 51 and the second nozzle members 52 are fabricated as separate bodies and then assembled together in the present exemplary embodiment, they may be fabricated as a single body. By way of example, by forming multiple number of holes at a single column, the first nozzle member 51 and the second nozzle members 52 may be formed as one body.

As shown in FIG. 6, the first nozzle member 51 has a discharge opening 53 through which the drying liquid L is discharged toward the intersection point B located directly below. Meanwhile, each second nozzle member 52 has a discharge opening 54 through which the drying liquid L is discharged toward the intersection point B located diagonally below. Conventionally, since the drying liquid L is usually discharged directly downwards, the discharge amount of the first nozzle member 51 may be determined by using an already acquired large quantity of data.

The discharge amount of the first nozzle member 51 is set in consideration of a material of the substrate W, the irregularity pattern, a position of the opening edge of the liquid film F, and so forth. The drying liquid L is basically discharged directly downwards, and the discharge direction is appropriately adjusted to be oriented diagonally downwards to suppress spattering of the drying liquid L. The discharge amount of the second liquid nozzle 52 is also set in consideration of the material of the substrate W, the irregularity pattern, the position of the opening edge of the liquid film F, and so forth.

An area of the discharge opening 53 of the first nozzle member 51 may be equal to or larger than an area of the discharge opening 54 of the second nozzle member 52. The discharge amount of the first nozzle member 51 is basically larger than the discharge amount of the second nozzle member 52. Among the two liquid flows, since the liquid flow having the larger flow rate has a large thickness, the two liquid flows can be allow to join each other at the intersection point B smoothly, so that the liquid spattering at the intersection point B can be suppressed. Further, though the discharge openings 53 and 54 have a circular shape in the present exemplary embodiment, they may have, by way of example, a rectangular, triangular or arterial shape.

Figure 7:
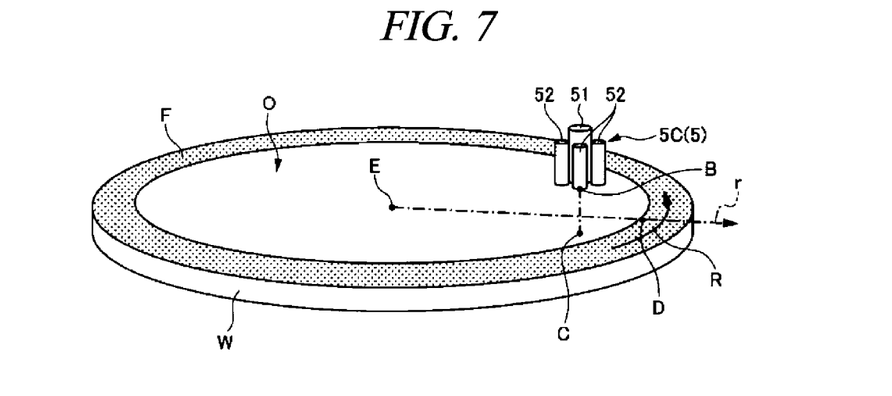
FIG. 7 is a perspective view illustrating an example of a positional relationship between an intersection point, a directly-under point, a collision point and a center point.

The collision angle θ of the drying liquid L on the top surface of the substrate W is mainly defined by the discharge amount and the discharge direction of the drying liquid L of the first nozzle member 51 and the discharge amount and the discharge direction of the drying liquid L of the second nozzle member 52. The collision angle θ is represented by a positional relationship between the intersection point B, a directly-under point C, a collision point D and a center point E shown in FIG. 7. The intersection point B is an intersection point between the discharge line A1 of the first nozzle member 51 and the discharge lines A2 of the second nozzle members 52 as mentioned above. The directly-under point C is a point on the top surface of the substrate W directly under the intersection point B, and this directly-under point C coincides with the intersection point B when viewed from the top. The collision point D is a point where the liquid flow of the drying liquid L collides with the top surface of the substrate W. The center point E is a center point of the top surface of the substrate W, and this is a rotation center portion of the substrate W. The collision angle θ includes, by way of example, a first collision angle θ1, a second collision angle θ2, and a third collision angle θ3.

Figure 8:
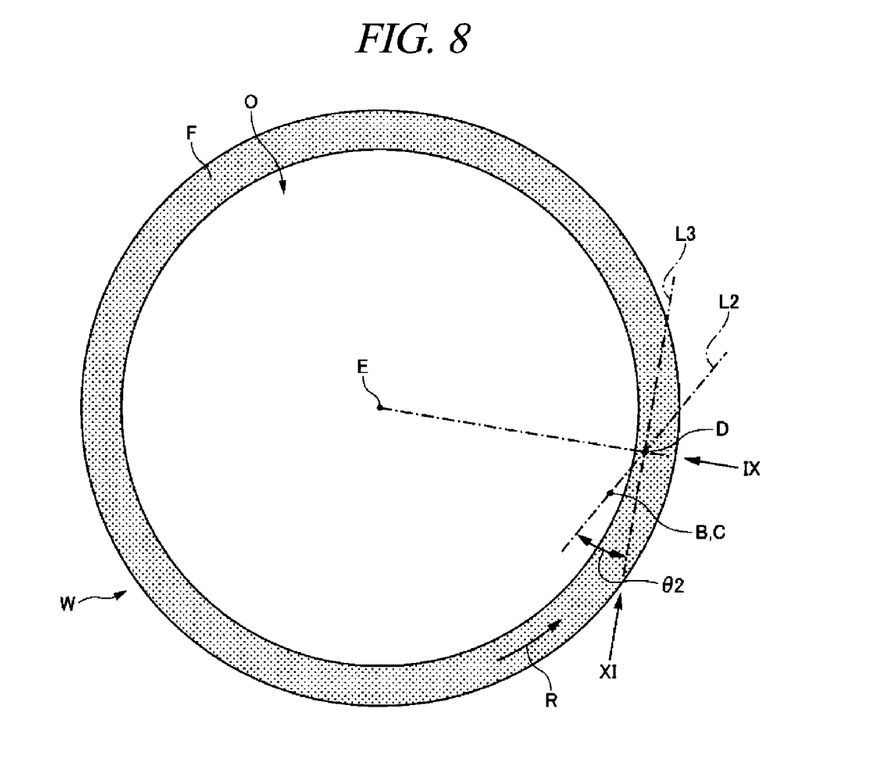
FIG. 8 is a plan view illustrating the example of the positional relationship between the intersection point, the directly-under point, the collision point and the center point.
Figure 9:
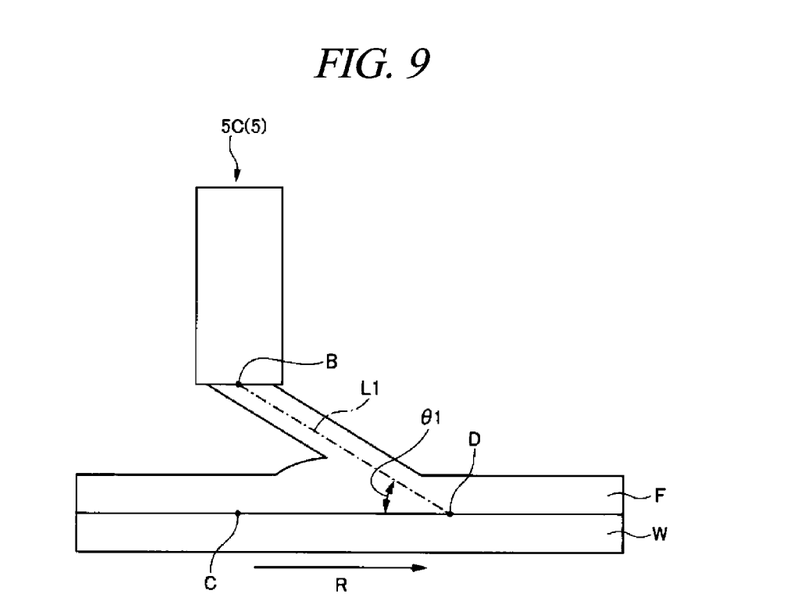
FIG. 9 is a diagram illustrating an example of a liquid film seen from a direction of an arrow IX in FIG. 8.

The first collision angle θ1 is an angle formed by the top surface of the substrate W and a straight line L1 connecting the intersection point B and the collision point D, as shown in FIG. 9, when viewed from a straight line direction connecting the collision point D and the center point E (for example, a direction of an arrow IX shown in FIG. 8). As the collision point D is more deviated from the directly-under point C to the front of a rotational direction (i.e., in a direction indicated by an arrow R) of the substrate W, the first collision angle θ1 decreases. Further, as the collision point D is more deviated from the directly-under point C to the back in the rotational direction of the substrate W (i.e., in an opposite direction from the direction of the arrow R), the first collision angle θ1 increases. When the collision point D is located at the directly-under point C, the first collision angle θ1 is 90°. The first collision angle θ1 is larger than 0° and smaller than 180°.

The second collision angle θ2 is an angle formed by a straight line L2 connecting the directly-under point C and the collision point D and a tangent line L3 of a circle centered on the center point E at the collision point D, as shown in FIG. 8. As the collision point D is more deviated from the directly-under point C outwards in the diametrical direction of the substrate W, the second collision angle θ2 increases. Further, as the collision point D is more deviated from the directly-under point C inwards in the diametrical direction of the substrate W, the second collision angle θ2 decreases. When the tangent line L3 passes through the directly-under point C, the second collision angle θ2 is 0°. The second collision angle θ2 is larger than −90° and smaller than 90°.

Figure 11:
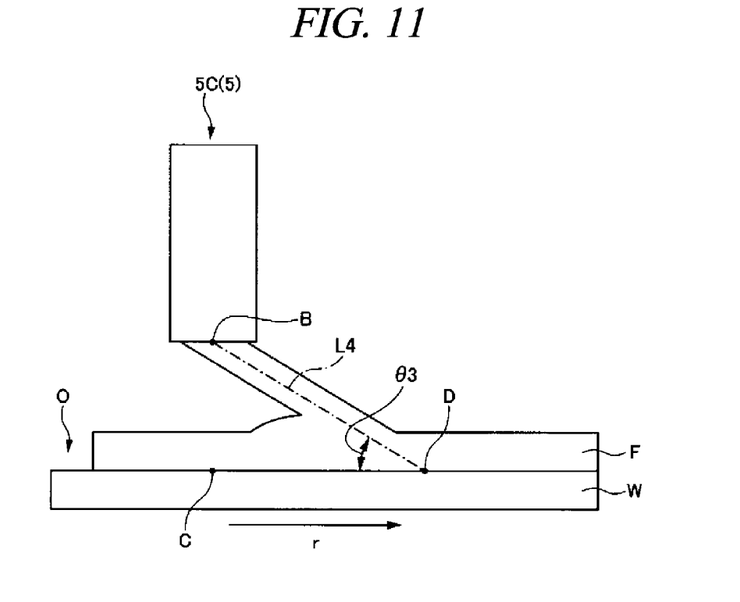
FIG. 11 is a diagram illustrating an example of the liquid film seen from a direction of an arrow XI in FIG. 8.

The third collision angle θ3 is an angle formed by the top surface of the substrate W and a straight line L4 connecting the intersection point B and the collision point D, as shown in FIG. 11, when viewed from a direction of the tangent line L3 (for example, a direction of an arrow XI shown in FIG. 8). As the collision point D is more deviated from the directly-under point C outwards in the diametrical direction of the substrate W (i.e., in a direction indicated by an arrow r), the third collision angle θ3 decreases. Further, as the collision point D is more deviated from the directly-under point C inwards in the diametrical direction of the substrate W (i.e., in an opposite direction from the direction of the arrow r), the third collision angle θ3 increases. When the collision point D is located at the directly-under point C, the third collision angle θ3 is 90°. The third collision angle θ3 is larger than 0° and smaller than 180°.

The collision angle θ is determined by the discharge amount and the discharge direction of the drying liquid L of the first nozzle member 51 and the discharge amount and the discharge direction of the drying liquid L of the second nozzle member 52, as stated above. If, however, an air flow formed above the substrate W is disturbed, the collision angle θ may fluctuate.

In this regard, the substrate processing apparatus 1 may be equipped with a detector 11, as shown in FIG. 1. The detector 11 detects the collision angle θ of the drying liquid L on the top surface of the substrate W. The detector 11 is, by way of non-limiting example, an infrared sensor or a camera, and detects the collision angle θ of the drying liquid L by receiving an infrared ray, visible light or the like. The collision angle θ as a target of the detection is at least one of the first collision angle θ1, the second collision angle θ2 and the third collision angle θ3. The detector 11 sends a signal indicating the detected collision angle θ to the controller 9.

The controller 9 controls the first flow rate controller 62 and the second flow rate controller 64 to reduce a deviation between a detection value of the detector 11 and a set value. Thus, the fluctuation of the collision angle θ that might be caused by disturbance such as the disturbed air flow can be suppressed.

Furthermore, the controller 9 may control the discharge amount of the drying liquid L of the first nozzle member 51 and the discharge amount of the drying liquid L of the second nozzle member 52 based on previously set values. It is because, if there is no disturbance, the collision angle θ of the drying liquid L is determined by the discharge amount and the discharge direction of the drying liquid L form the first nozzle member 51 and the discharge amount and the discharge direction of the drying liquid L from the second nozzle member 52.

In the process S5 of FIG. 4, however, as illustrated in FIG. 2, the moving unit 7 moves the drying liquid nozzle 5C from the inner side toward the outer side of the substrate W in the diametrical direction thereof, so that the opening O is formed at the center of the liquid film F. Then, by expanding the opening edge from the center of the substrate W toward the periphery thereof, the substrate W is dried.

When the moving of the drying liquid nozzle 5C is begun, the drying liquid nozzle 5C is located directly above the center point E. At this time, the collision point D coincides with the center point E; the collision angle θ1 and the collision angle θ3 are 90°; and the collision angle θ2 is 0°. The drying liquid L is supplied onto the center point E from directly above the center point E and uniformly flown from the center point E in a radial shape by a centrifugal force. As a result, the liquid film F having a uniform thickness can be formed.

After the moving of the drying liquid nozzle 5C is begun, the collision point D is distanced apart from the center point E, and the opening O is formed at the center of the liquid film F of the drying liquid L. The collision point D is formed at an outside of the opening edge.

When a rotation speed of the substrate W is constant, a tangential velocity of the substrate W at the collision point D increases as the collision point D is distanced farther from the center point E. Since the drying liquid L is rotated along with the substrate W by being dragged by the substrate W, a tangential velocity of the drying liquid L at the collision point D also increases.

Figure 10:
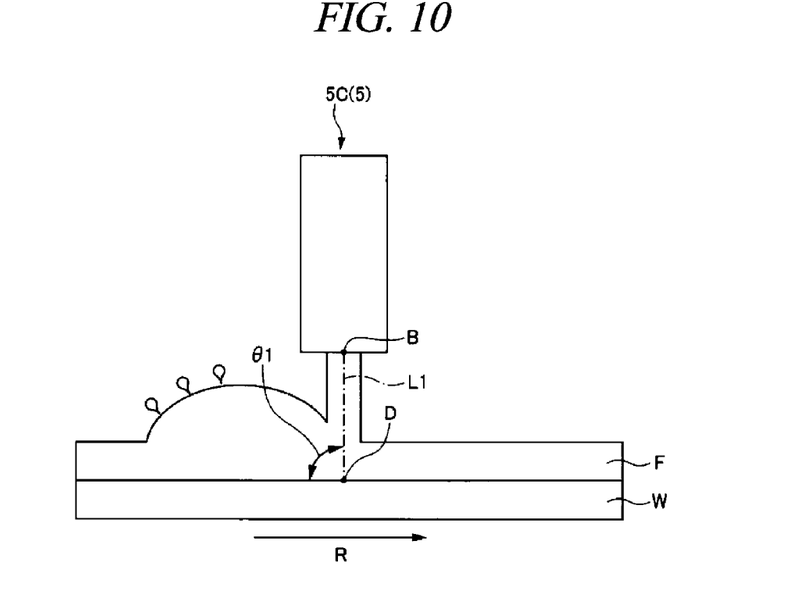
FIG. 10 is a diagram illustrating an example of the liquid film when a first collision angle θ1 shown in FIG. 9 is 90°.

If the first collision angle θ1 is maintained at 90° even if the collision point D is distanced apart from the center point E, the liquid film F having an excessively large thickness is formed at the rear of the collision point D in the rotational direction (i.e., an opposite direction from the direction indicated by the arrow R), as shown in FIG. 10. As a result, liquid spattering occurs. If the collision angle θ1 is maintained at 90°, the drying liquid L tends to be uniformly diffused from the collision point D to the front and to the back in the rotational direction. At the rear of the collision point D in the rotational direction, however, the drying liquid L is dragged by the substrate W being rotated and is thus pushed back to the collision point D. As a result, the thickness of the liquid film F is increased at the rear of the collision point D in the rotational direction, raising a likelihood of liquid spattering. This tendency becomes conspicuous as the collision point D is distanced farther from the center point E. It is because the tangential velocity at the collision point D increases as the collision point D is distanced apart from the center point E.

In consideration of this, the controller 9 decreases the first collision angle θ1 continuously or in stages, as shown in FIG. 9, in the process of moving the drying liquid nozzle 5C from the inner side to the outer side of the substrate W in the diametrical direction thereof. Accordingly, a liquid amount flowing from the collision point D to the back in the rotational direction can be reduced, so that the formation of the liquid film F having the excessively large thickness at the rear of the collision point D in the rotational direction can be suppressed. Therefore, liquid spattering can be suppressed, and, thus, particle generation can be suppressed.

Further, when the rotational speed of the substrate W is constant, the centrifugal force acting on the drying liquid L at the collision point D increases as the collision point D is distanced farther from the center point E. Since the centrifugal force is enhanced, the drying liquid L is strongly pushed outwards in the diametrical direction (i.e., in a direction indicated by an arrow r in FIG. 12).

Figure 12:
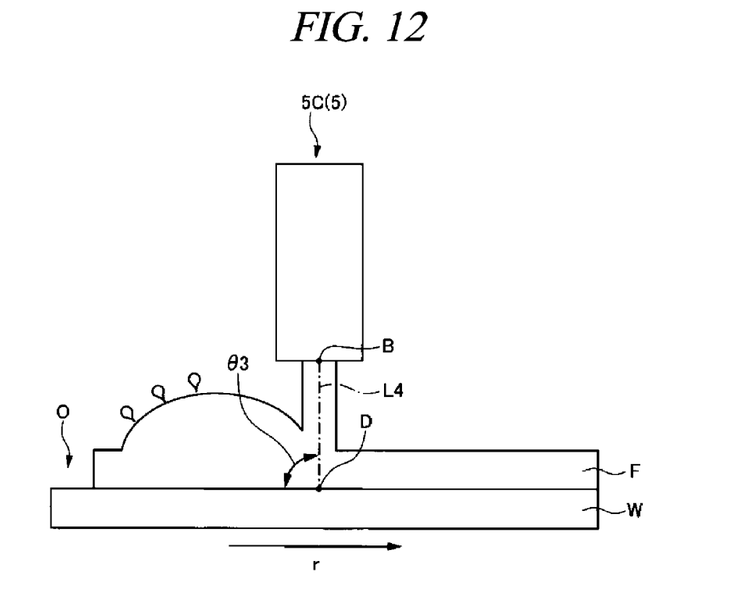
FIG. 12 is a diagram illustrating an example of the liquid film when a third collision angle θ3 shown in FIG. 11 is 90°.

If the third collision angle θ3 is maintained at 90° even if the collision point D is distanced apart from the center point E, the liquid film F having an excessively large thickness is formed at an inner side than the collision point D in the diametrical direction (i.e., in an opposite direction from the direction indicated by the arrow r), as shown in FIG. 12. As a result, liquid spattering occurs. If the third collision angle θ3 is maintained at 90°, the drying liquid L tends to be uniformly diffused from the collision point D both inwards and outwards in the diametrical direction. At the inner side than the collision point D in the diametrical direction, however, the drying liquid L is pushed back to the collision point D by the centrifugal force. As a result, the thickness of the liquid film F is increased at the inner side than the collision point D in the diametrical direction, raising a likelihood of liquid spattering. This tendency becomes conspicuous as the collision point D is distanced farther from the center point E. It is because the centrifugal force at the collision point D increases as the collision point D is distanced apart from the center point E.

In consideration of this, the controller 9 decreases the third collision angle θ3 continuously or in stages, as shown in FIG. 11, in the process of moving the drying liquid nozzle 5C from the inner side of the substrate W to the outer side of the substrate W in the diametrical direction thereof. Thus, a liquid amount flowing from the collision point D inwards in the diametrical direction can be reduced, so that the formation of the liquid film F having the excessively large thickness at the inner side than the collision point D in the diametrical direction can be suppressed. Therefore, liquid spattering can be suppressed, and, thus, particle generation can be suppressed. Moreover, the opening edge of the liquid film F can be suppressed from collapsing inwards.

Further, in the process of moving the drying liquid nozzle 5C from the inner side of the substrate W toward the outer side of the substrate W in the diametrical direction, the controller 9 increases the second collision angle θ2 continuously or in stages, as shown in FIG. 8. Accordingly, a liquid amount flowing from the collision point D inwards in the diametrical direction can be reduced, so that the formation of the liquid film F having the excessively large thickness at the inner side than the collision point D in the diametrical direction can be suppressed. Therefore, liquid spattering can be suppressed, and, thus, particle generation can be suppressed. Further, the opening edge of the liquid film F can be suppressed from collapsing inwards.

Moreover, in the process S5 of FIG. 4, along with the expansion of the opening edge of the liquid film F, the moving unit 7 moves a collision point of the drying gas G from the center of the substrate W toward a periphery thereof, as illustrated in FIG. 2. The discharge of the drying gas G is begun after the opening O is formed at the liquid film F. The collision point of the drying gas G is set to be located in the opening O of the liquid film F and made to follow the edge of the opening O to press the edge of the opening O from the inside thereof.

In the process of moving the drying liquid nozzle 5C from the inner side of the substrate W toward the outer side of the substrate W in the diametrical direction, the controller 9 may control a collision angle θ of the drying gas G in the same way as the collision angle θ of the drying liquid L is controlled. That is, the controller 9 may reduce a first collision angle θ1 of the drying gas G continuously or in stages. Further, the controller 9 may increase a second collision angle θ2 of the drying gas G continuously or in stages. Furthermore, the controller 9 may reduce a third collision angle θ3 of the drying gas G continuously or in stages. In addition, as compared to the third collision angle θ3 of the drying liquid L which is gradually reduced from 90°, the third collision angle θ3 of the drying gas G may be gradually reduced, starting from an angle smaller than 90° in order to press the opening edge of the liquid film F from the inside efficiently from the beginning.

In the process of moving the drying liquid nozzle 5C from the inner side toward the outer side of the substrate W in the diametrical direction thereof, though the controller 9 reduces the third collision angle θ3 of the drying liquid L continuously or in stages, the present disclosure is not limited thereto. By way of example, if the drying liquid L remains in the opening O of the liquid film F, the controller 9 may increase the third collision angle θ3 of the drying liquid L temporarily, thus allowing the opening edge of the liquid film F to be narrowed temporarily. Since the opening edge of the liquid film F is narrowed temporarily, the controller 9 may also increase the third collision angle θ3 of the drying gas G temporarily. Afterwards, the controller 9 reduces the third collision angle θ3 of the drying liquid L and the third collision angle θ3 of the drying gas G continuously or in stages while moving the drying gas nozzle 5D from the inner side toward the outer side of the substrate W in the diametrical direction.

Further, though the controller 9 of the present exemplary embodiment varies the collision angle θ of the fluid in the process of moving the nozzle 5 from the inner side toward the outer side of the substrate W in the diametrical direction, the present disclosure is not limited thereto. The controller 9 may change the collision angle θ of the fluid in a process of moving the nozzle 5 from the outer side toward the inner side of the substrate W in the diametrical direction. In addition, the fluid to be subjected to the control of the collision angle θ is not limited to the drying liquid L and the drying gas G. By way of example, the fluid may be a chemical liquid or a rinse liquid.

So far, the exemplary embodiment of the substrate processing system and the substrate processing method have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

By way of example, the discharge direction of the first nozzle member 51 is not limited to being directly below but may be diagonally below. For example, one of the two second nozzle members 52 shown in FIG. 6 may be used as the first nozzle member 51. In this case, if the first nozzle member 51 and the second nozzle member 52 discharge the drying liquid L at the same discharge amount, a liquid flow flowing directly downwards from the intersection point B can be formed.

According to the exemplary embodiment, it is possible to suppress particle adhesion to the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
a holder configured to hold a substrate horizontally;
a substrate rotating unit configured to rotate the holder and the substrate thereon around a vertical rotation axis;
a nozzle configured to supply a fluid onto a top surface of the substrate held by the holder;
a supply unit configured to supply the fluid to the nozzle; and
a moving unit configured to move the nozzle in a diametrical direction of the substrate,
wherein the nozzle comprises a first nozzle member configured to discharge the fluid and a second nozzle member configured to discharge the fluid in a direction different from a direction in which the first nozzle member discharges the fluid,
a first discharge line as an extension line of a flow path from the first nozzle member and a second discharge line as an extension line of a flow path from the second nozzle member intersect with each other at an intersection point,
the supply unit comprises a first flow rate controller configured to control a discharge amount of the first nozzle member and a second flow rate controller configured to control a discharge amount of the second nozzle member independently from the discharge amount of the first nozzle member,
wherein the apparatus further comprises:
a detector configured to detect a collision angle of the fluid on the top surface of the substrate; and
a controller configured to control the first flow rate controller and the second flow rate controller to reduce a deviation between a detection value of the detector and a set value.

2. The substrate processing apparatus of claim 1,
Wherein the second nozzle member includes second nozzle members, and four or more second nozzle members are equi-spaced around the first discharge line.

3. The substrate processing apparatus of claim 2,
wherein the first nozzle member has a discharge opening through which the fluid is discharged toward the intersection point located directly therebelow, and
the second nozzle member has a discharge opening through which the fluid is discharged toward the intersection point located diagonally therebelow.

4. The substrate processing apparatus of claim 2,
wherein an area of a discharge opening of the first nozzle member is equal to or larger than an area of a discharge opening of the second nozzle member.

5. The substrate processing apparatus of claim 2,
wherein the fluid is a drying liquid configured to first cover an entire top surface of the substrate and then expose the substrate gradually from a center of the substrate toward a periphery thereof, or the fluid is a drying gas configured to press an opening edge of the drying liquid.

6. The substrate processing apparatus of claim 1,
wherein the first nozzle member has a discharge opening through which the fluid is discharged toward the intersection point located directly therebelow, and
the second nozzle member has a discharge opening through which the fluid is discharged toward the intersection point located diagonally therebelow.

7. The substrate processing apparatus of claim 6,
wherein an area of a discharge opening of the first nozzle member is equal to or larger than an area of a discharge opening of the second nozzle member.

8. The substrate processing apparatus of claim 6,
wherein the fluid is a drying liquid configured to first cover an entire top surface of the substrate and then expose the substrate gradually from a center of the substrate toward a periphery thereof, or the fluid is a drying gas configured to press an opening edge of the drying liquid.

9. The substrate processing apparatus of claim 1,
wherein an area of a discharge opening of the first nozzle member is equal to or larger than an area of a discharge opening of the second nozzle member.

10. The substrate processing apparatus of claim 1,
wherein the fluid is a drying liquid configured to first cover an entire top surface of the substrate and then expose the substrate gradually from a center of the substrate toward a periphery thereof, or the fluid is a drying gas configured to press an opening edge of the drying liquid.

11. A substrate processing apparatus, comprising:
a holder configured to hold a substrate horizontally;
a substrate rotating unit configured to rotate the holder and the substrate thereon around a vertical rotation axis;
a nozzle configured to supply a fluid onto a top surface of the substrate held by the holder;
a supply unit configured to supply the fluid to the nozzle; and
a moving unit configured to move the nozzle in a diametrical direction of the substrate,
wherein the nozzle comprises a first nozzle member configured to discharge the fluid and a second nozzle member configured to discharge the fluid in a direction different from a direction in which the first nozzle member discharges the fluid,
a first discharge line as an extension line of a flow path from the first nozzle member and a second discharge line as an extension line of a flow path from the second nozzle member intersect with each other at an intersection point,
the supply unit comprises a first flow rate controller configured to control a discharge amount of the first nozzle member and a second flow rate controller configured to control a discharge amount of the second nozzle member independently from the discharge amount of the first nozzle member, wherein the nozzle further comprises a revolving unit configured to revolve the second nozzle member around the first discharge line.

12. A substrate processing method, comprising:

moving a nozzle, which is configured to supply a fluid onto a top surface of a substrate, in a diametrical direction of the substrate in a state that the substrate is held horizontally and is being rotated around a vertical rotation axis;

detecting a collision angle of the fluid on the top surface of the substrate; and controlling a discharge amount of the nozzle to reduce a deviation between a detection value of the detecting and a set value, wherein the nozzle comprises a first nozzle member configured to discharge the fluid and a second nozzle member configured to discharge the fluid in a direction different from a direction in which the first nozzle member discharges the fluid, a first discharge line as an extension line of a flow path from the first nozzle member and a second discharge line as an extension line of a flow path from the second nozzle member intersect with each other at an intersection point, and at least one of a discharge amount of the first nozzle member or a discharge amount of the second nozzle member is varied while the nozzle is being moved in the diametrical direction of the substrate.

13. The substrate processing method of claim 12, wherein the first nozzle member discharges the fluid toward the intersection point directly therebelow, and the second nozzle member discharges the fluid toward the intersection portion diagonally therebelow.

14. The substrate processing method of claim 12, further comprising:

decreasing a first collision angle continuously or in stages while moving the nozzle from an inner side of the substrate in the diametrical direction toward an outer side of the substrate in the diametrical direction, wherein the first collision angle is an angle formed by the top surface of the substrate and a straight line connecting the intersection point and a collision point of the fluid on the top surface of the substrate, when viewed from a direction of a straight line connecting the collision point and a center point of the top surface of the substrate, and the first collision angle decreases as the collision point is more deviated to a front of a rotational direction of the substrate from a directly-under point on the top surface of the substrate directly below the intersection point.

15. The substrate processing method of claim 12, further comprising:

increasing a second collision angle continuously or in stages while moving the nozzle from an inner side of the substrate in the diametrical direction toward an outer side of the substrate in the diametrical direction thereof, wherein the second collision angle is an angle formed by a straight line connecting a directly-under point on the top surface of the substrate directly under the intersection point and a collision point of the fluid on the top surface of the substrate and a tangent line of a circle centered on a center point of the top surface of the substrate at the collision point, and the second collision angle increases as the collision point is more deviated from the directly-under point outwards in the diametrical direction of the substrate.

16. The substrate processing method of claim 12, further comprising:

decreasing a third collision angle continuously or in stages while moving the nozzle form an inner side of the substrate in the diametrical direction toward an outer side of the substrate in the diametrical direction thereof, wherein the third collision angle is an angle formed by the top surface of the substrate and a straight line, when viewed from a direction of a tangent line of a circle centered on a center point of the top surface of the substrate at a collision point of the fluid on the top surface of the substrate, connecting the intersection point and the collision point, and the third collision angle decreases as the collision point is more deviated from a directly-under point on the top surface of the substrate directly under the intersection point outwards in the diametrical direction of the substrate.

17. The substrate processing method of claim 12, wherein the fluid is a drying liquid configured to first cover an entire top surface of the substrate and then expose the substrate gradually from a center of the substrate toward a periphery thereof, or the fluid is a drying gas configured to press an opening edge of the drying liquid.

18. A substrate processing apparatus, comprising:

a holder configured to hold a substrate horizontally;

a substrate rotating unit configured to rotate the holder and the substrate thereon around a vertical rotation axis;

a nozzle configured to supply a fluid onto a top surface of the substrate held by the holder;

a supply unit configured to supply the fluid to the nozzle; and a moving unit configured to move the nozzle in a diametrical direction of the substrate, wherein the nozzle comprises a first nozzle member configured to discharge the fluid and a second nozzle member configured to discharge the fluid in a direction different from a direction in which the first nozzle member discharges the fluid, a first discharge line as an extension line of a flow path from the first nozzle member and a second discharge line as an extension line of a flow path from the second nozzle member intersect with each other at an intersection point, the supply unit comprises a first flow rate controller configured to control a discharge amount of the first nozzle member and a second flow rate controller configured to control a discharge amount of the second nozzle member independently from the discharge amount of the first nozzle member, wherein the second nozzle member includes second nozzle members, and four or more second nozzle members are equi-spaced around the first discharge line, wherein the nozzle further comprises a revolving unit configured to revolve the second nozzle member around the first discharge line.

* * * * *